United States Patent Office 3,345,217

Patented Oct. 3, 1967

3,345,217

METHOD OF CLEANING AND PHOSPHATIZING COPPER CIRCUITS

Herbert R. Wollgien and Edward H. Chang, Minneapolis, Minn., assignors to Fremont Industries, Inc., Minneapolis, Minn., a corporation of Minnesota No Drawing. Filed June 1, 1964, Ser. No. 371,789
5 Claims. (Cl. 148—6.15)

The present invention relates generally to an improved process for cleaning copper which is disposed on an electrical insulating surface, and more specifically to an improved technique for cleaning and deoxidizing the copper on a printed wiring board.

In the preparation of printed wiring panels, boards, and the like, copper line formation is normally accomplished by means of applying a resist and then chemically milling the exposed copper in the presence of this resist. The resist obtains its definition and arrangement by various techniques. Among these techniques are the photo techniques, silk-screen techniques, masking techniques, and the like. Obviously, it is critical that the surface of the copper be clean and free from foreign contaminates in order to insure that a uniform bond be established between the resist material and the copper surface. Naturally, any flaw in the bond between the resist and the copper will create a corresponding flaw in the finished product. When the adhesion is strong and uniform between the copper surface and the resist material, enhanced circuit or wiring paths and arrangements may be developed. With this improved adhesion between the masking material and the surface of the copper, a finer edge definition may be obtained in the finished product, and accordingly a finer line may be ultimately fabricated.

The surface of copper, when exposed to the atmosphere, particularly the atmosphere normally encountered in the manufacturing establishment, may react to acquire a highly resistant surface film of compounds of the metal such as oxides, carbonates, sulfides, or the like. In order to accomplish removal of these foreign film deposits, it is normally necessary to utilize an acid cleaner, this being deemed most useful in connection with these impurities. Accordingly, fabrication practice in the preparation of printed wiring demands clean, compound-free surfaces, including carbonate-free, sulfide-free and oxide-free copper.

At the present time, acid cleaners are avoided because of their normally harsh treatments of the printed wiring elements. In this connection, the copper is normally in the range of from one-half to two mils in thickness, hence any violent or harsh treatments must be avoided. Consequently, alkaline cleansers have normally been employed in order to prepare a clean surface. The alkaline materials suffer from the disadvantage of lacking the ability to chemically attack the surface layer, hence the alkaline cleansers function primarily as scouring powders and detergents.

In accordance with the present invention, an acidic cleaning material is available which will chemically attack the surface layer, this cleaning material having an inhibitor present which modifies the action of the acid cleaner to such an extent that extremely thin layers of copper may be treated without suffering from the adverse effects of the chemical action. The cleaning technique of the present invention provides an ideal combination of characteristics; the first being the ability of the acid cleaning solution to attack the surface impurities including oxides, carbonates, sulfides and the like, the second being the modifying or inhibiting action of the phosphate, which is included in the system, upon the acid reaction with the metal.

Therefore, it is an object of the present invention to provide an improved technique for cleaning the surface of a copper foil applied to the surface of insulating circuit boards or the like.

It is a further object of the present invention to provide an improved acid cleaner to remove impurity films, compounds, and oxides which may be present on the surface of a copper conductor, the acid cleaner having a modifier present to inhibit the attack on the metal per se.

It is yet a further object of the present invention to provide an improved technique for cleaning copper conductors applied to insulating boards and the like, wherein the cleaning compound contains an acid, a modifier, and a fine abrasive.

Other and further objects of the present invention will become apparent to those skilled in the art upon a study of the following specification and appended claims.

In accordance with the preferred modification of the present invention, a cleaning mixture is prepared having the following composition:

| Ingredient: | Parts |
|---|---|
| Silica flour | 85.00 |
| $NaH_2PO_4$ | 3.00 |
| $H_3PO_4$ (75 percent) | 4.00 |
| Oxalic acid | 6.00 |
| Sodium dodecyl benzene sulfonate (anionic wetting agents are preferred) | 2.00 |

This material is in the form of a free flowing powder, and hence may be applied directly to the surface of the printed wiring assembly. Normally, this operation is conducted prior to the application of a resist, such as a photo resist or a silk-screen resist. The primary ingredients of the mixture are the oxalic acid together with the phosphates including the phosphoric acid and the sodium phosphates, monobasic. In this combination, the oxalic acid is utilized to attack the surface of the copper and render it free of oxides, carbonates, sulfides, as well as other compounds. If desired, a chelating agent may be added, however the oxalic acids in this environment function similarly to a chelating agent. This concentration of oxalic acid is sufficiently modest to permit the mixture to be handled by ordinary, non-sensitive hands.

The phosphate functions as a modifier, and accordingly is included in the system in a ratio somewhere in the range wherein the phosphate, calculated as $[PO_4]\equiv$ and the oxalate of the hydrogen oxalate (oxalic acid) are present in substantially equi-normal quantities. It has been found that this ratio is necessary in order to permit the phosphate to act as an inhibitor to the system. It will be appreciated that a greater quantity of phosphate may be present, however, it is generally preferable that the ratio be not greater than 2:1. On the other hand, a lesser quantity of phosphate may be present, however, in order to provide the inhibiting action, it is generally felt that a ratio of normality should not be less than 1:2. While the phosphate could be added as other phosphate salts, generally it is normally preferred that the phosphate compound which is utilized be one which is generally acid in nature. The phosphate preserves the brightness and freedom from surface film formation over an extended period of time.

The use of phosphoric acid is preferred for its generally low cost, however, since this material is generally available as a liquid, and must be sprayed into the system, it is preferable that this ingredient be held at a relatively low or modest quantity. The remaining phosphate is provided in the monobasic sodium phosphate. This material is desirable because of its generally acid characteristics in the enviroment utilized. Of course, it will be appreciated that other phosphates may be utilized as well, if desired.

The silica flour is employed as an abrasive. In order for it to function properly on the copper conductors of a printed wiring board, the material should be such that at least 99 percent passes through a 140 mesh screen. A coarser material will be generally too harsh on the copper members, and a finer material will be generally more difficult to rinse off. The wetting agent is utilized in order to promote the general characteristics of the material including rinsability of the copper surface. It will be appreciated that any of the commonly employed solid or liquid wetting agents may be utilized, however anionic wetting agents are preferred.

If the material is generally in the form of a free-flowing powder, it may be used as a paste, or merely sprinkled on a wet surface and scrubbed. The nature of the application will depend upon the existing methods and dispensing equipment available.

The material retains its tarnish resisting characteristics or film forming resisting properties for a reasonable period of time. Thus, the copper surface remains bright and spotless. The material is readily rinseable and, hence, no residue will remain on the surface of the copper that may interfere with subsequent operations.

On exposure to the air, surface films form on copper, including carbonates, sulfates, sulfides, chlorides, as well as oxides. Oxalic acid is desirable as a cleaner in view of its ability to form water soluble complexes with copper. In addition to oxalic acid, other polybasic carboxylic acids may be employed, however, oxalic acid is preferred because of its high acidity. In this regard, hydroxycarboxylic acids such as citric acid or tartaric acid, or sugar acids, such as gluconic acid, could be employed, these acids also forming a soluble complex with copper. The oxalic acid is generally preferred. When a photo-sensitive resist is employed, it is critical that the surface of the copper be free from contamination due to formation of surface films. In this regard, the presence of these films may permit the material used to remove the removable portion of the photo resist to creep under and actually disturb the edge definition of the resist remaining in contact with the surface of the copper. Thus, a feathered edge will result which is obviously undesirable in a printed wiring arrangement.

It will, of course, be understood that various changes may be made in the form, details, arrangements and proportions of the parts without departing from the scope of the invention as set forth in the appended claims.

What is claimed is:

1. The method of cleaning and removing surface films from the exposed surface of copper conductors disposed on the surface of an insulating base of a printed wiring board comprising the steps of applying and wiping a free flowing powder or paste mixture of oxalic acid, an acid phosphate, together with a finely divided grit onto said exposed conductor surface, said acid phosphate in said mixture consisting essentially of an alkaline earth phosphate and phosphoric acid, the ratio of the phosphate ion to the oxalate ion in the mixture being in the range of from between about 2:1 and 1:2, said finely divided grit in said mixture consisting essentially of silica flour having a particle size generally below about 140 mesh and forming substantially 85 percent of the composition mix.

2. The method as defined in claim 1 being particularly characterized in that said acid phosphate consists essentially of monobasic sodium phosphate and phosphoric acid in the ratio of about 4 parts of phosphoric acid to 3 parts of monobasic sodium phosphate.

3. The method as set forth in claim 2 being particularly characterized in that said mixture includes an anionic wetting agent.

4. The method as set forth in claim 3 being particularly characterized in that said anionic wetting agent is sodium dodecyl benzene sulfonate.

5. The method as set forth in claim 2 being particularly characterized in that said mixture contains a wetting agent consisting essentially of sodium dodecyl benzene sulfonate forming about 2 percent of the composition mix.

References Cited

UNITED STATES PATENTS

| | | | |
|---|---|---|---|
| 2,326,837 | 8/1943 | Coleman | 134—3 X |
| 2,653,420 | 9/1953 | Ruth. | |
| 3,075,866 | 1/1963 | Baker et al. | 156—13 |

JACOB STEINBERG, *Primary Examiner.*